(12) United States Patent
Sugg et al.

(10) Patent No.: US 7,830,941 B2
(45) Date of Patent: Nov. 9, 2010

(54) WAVELENGTH SELECTIVE AND TUNABLE SEMICONDUCTOR LASER DEVICE WITH COUPLED CAVITIES

(75) Inventors: Alan R. Sugg, Naperville, IL (US); David S. McCallum, West Chicago, IL (US)

(73) Assignee: Vega Wave Systems, Inc., West Chicago, IL (US)

( * ) Notice: Subject to any disclaimer, the term of this patent is extended or adjusted under 35 U.S.C. 154(b) by 45 days.

(21) Appl. No.: 12/022,633

(22) Filed: Jan. 30, 2008

(65) Prior Publication Data

US 2008/0181265 A1 Jul. 31, 2008

Related U.S. Application Data

(60) Provisional application No. 60/898,114, filed on Jan. 30, 2007, provisional application No. 60/898,115, filed on Jan. 30, 2007, provisional application No. 60/898,118, filed on Jan. 30, 2007.

(51) Int. Cl.
*H01S 3/10* (2006.01)
*H01S 5/00* (2006.01)

(52) U.S. Cl. ..................... 372/50.12; 372/20
(58) Field of Classification Search ............ 372/20, 372/50.12
See application file for complete search history.

(56) References Cited

U.S. PATENT DOCUMENTS

| | | | |
|---|---|---|---|
| 4,608,697 A | 8/1986 | Coldren | |
| 4,896,325 A | 1/1990 | Coldren | |
| 5,262,360 A | 11/1993 | Holonyak, Jr. et al. | |
| 5,353,295 A * | 10/1994 | Holonyak et al. | 372/50.12 |
| 5,373,522 A | 12/1994 | Holonyak, Jr. et al. | |
| 5,567,980 A | 10/1996 | Holonyak, Jr. et al. | |
| 5,696,023 A | 12/1997 | Holonyak, Jr. et al. | |
| 6,628,686 B1 * | 9/2003 | Sargent | 372/46.01 |

* cited by examiner

*Primary Examiner*—Minsun Harvey
*Assistant Examiner*—Patrick Stafford
(74) *Attorney, Agent, or Firm*—Patzik, Frank & Samotny, Ltd.

(57) ABSTRACT

An array of optically coupled cavities (called micro-cavities) of a semiconductor laser are defined by either an etch and/or by a native oxide of an aluminum-bearing III-V semiconductor material and are arranged serially end-to-end along the longitudinal direction. An etch and/or native oxide defines a refractive index change for the longitudinal optical mode and confines the optical field within the micro-cavities, resulting in reflection and optical feedback distributed periodically along the laser stripe in the form of an optically coupled micro-cavity. The wavelength of emission of the laser is controlled by a combination of the length of the optical micro-cavities and the spacing between adjacent optical micro-cavities. Single-longitudinal-mode operation is exhibited over an extended drive current range. In one embodiment, two or more linear arrays of end-coupled micro-cavities are arranged in the longitudinal axis of the laser cavity to obtain a tunable laser. The device, with multiple reflectors constructed out of optical micro-cavities, is tuned either thermally or by current injection partitioned among the elements. The tunable laser exhibits a vernier tuning amongst resonances of the two or more optically-coupled micro-cavities.

5 Claims, 11 Drawing Sheets

WAVELENGTH SELECTIVE AND TUNABLE SEMICONDUCTOR LASER DEVICE WITH COUPLED CAVITIES

CROSS-REFERENCES TO RELATED APPLICATIONS

This application claims priority to U.S. provisional application No. 60/898,114, filed on Jan. 30, 2007, the entirety of which is hereby incorporated by reference. This application also claims priority to U.S. provisional application No. 60/898,115, filed on Jan. 30, 2007, the entirety of which is hereby incorporated by reference. This application further claims priority to U.S. provisional application No. 60/898,118, filed on Jan. 30, 2007, the entirety of which is hereby incorporated by reference.

BACKGROUND OF THE INVENTION

1. Field of Invention

The present invention relates, in general, to lasers, and, specifically, to semiconductor lasers, including semiconductor lasers of the tunable variety.

2. Description of Related Art

Semiconductor lasers are commonly employed in a wide variety of applications, including computer networking, telecommunications, and numerous consumer electronics devices. Disclosures of prior art semiconductor lasers may be found, for example, in the following U.S. patents, the entirety of which are all hereby incorporated by reference: U.S. Pat. Nos. 4,896,325; 4,608,697; 5,353,295; 5,262,360; 5,696,023; 5,567,980; and 5,373,522.

The present invention relates to coupled-cavity semiconductor lasers, and methods for tuning such lasers. The present invention has particular, but not necessarily exclusive, application to tunable lasers for use in systems operating in the wavelengths ranges of 300 nm to 3000 nm. One particular application for the present invention is in 10 Gigabit fiber optical transceivers, fabricated in accordance with the 10 GBASE-LX4 standard (IEEE 802.3ae-2002), requiring four lasers with center wavelengths in the vicinity of 1275 nm, 1300 nm, 1325 nm, and 1350 nm, respectively.

BRIEF SUMMARY OF INVENTION

The present invention comprises device structures of semiconductor lasers that utilize coupled micro-cavities. Either an etch or a native oxide of Al-bearing III-V semiconductors is used to fabricate coupled-cavity lasers (CCLs). Specifically, the native oxide is used to define the short cavities that compose the CCL. Methods are also described for controlling the wavelength of operation of the CCL through features of the fabrication, so that it is consistent with a predetermined target wavelength. In addition, methods are described that enable the fabrication of tunable lasers constructed from multiple reflectors composed of optically coupled micro-cavities. Additional methods describe the manner in which such tunable lasers may be tuned.

The oxide defined coupled cavity laser is an improvement over prior art in several regards. First, the oxide-defined ridge has superior surface quality, i.e., the interface between the vertical oxide and the buried ridge is smoother and has fewer etch-induced defects, and therefore lower optical and electrical losses than the conventional etched ridge. Next, the CCL can be fabricated without using electron beam lithography: Conventional UV photolithography and/or phase mask control provides sufficient resolution to define the cavities. Finally, the oxide provides a convenient method of selecting the laser operating wavelength. By varying the length of the optical micro-cavity and the width and depth of the space between the micro-cavities through a vertical oxide layer or an etch, the laser operating wavelength can be predetermined.

In an embodiment of the present invention, an array of optically coupled cavities (called micro-cavities) of a semiconductor laser are defined by either an etch and/or by a native oxide of an aluminum-bearing III-V semiconductor material and are arranged serially end-to-end along the longitudinal direction. An etch and/or native oxide defines a refractive index change for the longitudinal optical mode and confines the optical field within the micro-cavities, resulting in reflection and optical feedback distributed periodically along the laser stripe in the form of an optically coupled micro-cavity. The wavelength of emission of the laser is controlled by a combination of the length of the optical micro-cavities and the spacing between adjacent optical micro-cavities. Single-longitudinal-mode operation is exhibited over an extended drive current range. In another embodiment of the present invention, two or more linear arrays of end-coupled micro-cavities are arranged in the longitudinal axis of the laser cavity to obtain a tunable laser. The device, with multiple reflectors constructed out of optical micro-cavities, is tuned either thermally or by current injection partitioned among the elements. The tunable laser exhibits a vernier tuning amongst resonances of the two or more optically-coupled micro-cavities.

In one embodiment of the present invention, a coupled-cavity semiconductor laser device is provided. In this embodiment, a semiconductor active region disposed between a first semiconductor confining layer and a second semiconductor confining layer. A plurality of first electrode elements are coupled with the first confining layer, with at least a portion of each of the first electrode elements being spaced apart from and being substantially collinear to each other. At least one second electrode is coupled with the second confining layer. A plurality of optically coupled micro-cavities is provided, with each of the optically coupled micro-cavities being defined by an associated one of said plurality of first electrode elements.

At least one inter-cavity spacing is also provided, comprising a region between an adjacent pair of optically coupled micro-cavities. The semiconductor laser device is capable of emitting light in the active region upon the application of electrical current between at least one of the first electrode elements and the second electrode. This emitted light has a plurality of wavelength resonances, with each of the plurality of wavelength resonances having values determined at least in part by a length of the plurality of optically-coupled micro-cavities. Moreover, the plurality of wavelength resonances has a dominant resonance wavelength having a value determined at least in part by a length of at least one inter-cavity spacing.

At least one of the optically coupled micro-cavities and at least one inter-cavity spacing are defined by etching a portion of the first confining layer, or by oxidizing a portion of the first confining layer, or by a combination of etching and oxidation of the first confining layer. At least a portion of the first confining layer comprises an aluminum-bearing III-V semiconductor material, at least one of the optically coupled micro-cavities and at least one of the inter-cavity spacings are defined by an oxide of the aluminum-bearing III-V semiconductor material formed in at least a portion of the first confining layer. At least a portion of the first confining layer comprises an aluminum-bearing III-V semiconductor material. At least one of the optically coupled micro-cavities and at least one of the inter-cavity spacings are defined by etching of the first confining layer, oxidation of the aluminum-bearing III-V semiconductor material in at least a portion of the first confining layer, or by a combination of etching and oxidation. Moreover, in a preferred embodiment, at least a portion of at least one of the optically coupled micro-cavities and at least a portion of at least one of the optical micro-cavity spacings are defined by etching at least a portion of the second confining layer, or by oxidizing a portion of the second confining layer, or by a combination of etching and oxidation of the second confining layer.

In one, tunable embodiment of the present invention, a first micro-cavity reflector is provided, formed from at least one of the optically coupled micro-cavities. A second micro-cavity reflector is also provided, formed from at least one of the optically coupled micro-cavities. The semiconductor laser device is capable of emitting light in the active region upon the application of electrical current between at least one of the first electrode elements and the second electrode. This emitted light has a plurality of wavelength resonances, with the plurality of wavelength resonances having values determined at least in part by a first length of the first micro-cavity reflector and a second length of the second micro-cavity reflector. Moreover, the plurality of wavelength resonances has a dominant resonance wavelength having a value determined at least in part by a length of the inter-cavity spacings.

In one embodiment, at least one of the first micro-cavity reflector and the second micro-cavity reflector comprises a plurality of regions of at least one of the optically coupled micro-cavities. Moreover, at least one of the optically coupled micro-cavities comprises a first reflective end and a second reflective end, with the first micro-cavity reflector and the second micro-cavity reflector being disposed at the first reflective end, the first micro-cavity reflector being adapted to produce a first set of reflective wavelength peaks having a first substantially uniform peak spacing, and the second micro-cavity reflector being adapted to produce a second set of reflective wavelength peaks having a second substantially uniform peak spacing. In this embodiment, the first micro-cavity reflector and the second micro-cavity reflector are capable of tuning by varying the amounts of electrical current injected into the first micro-cavity reflector and the second micro-cavity reflector to, in turn, substantially align the first reflective wavelength peaks and the second reflective wavelength peaks to form a supermode dominant resonance. Moreover, in this embodiment, a gain section is provided and is associated with the first optically coupled micro-cavity. The gain section has an associated electrode for passing current selectively to the gain section. The first micro-cavity reflector and the second micro-cavity reflector are positioned on a same side of the gain section. The gain section causes the coupled-cavity semiconductor laser device to lase at the supermode dominant resonance.

In an embodiment of the present invention, at least one of the first micro-cavity reflector and the second micro-cavity reflector has at least one associated electrode capable of passing electrical current selectively through the at least one associated electrode and to the at least one of the first micro-cavity reflector and the second micro-cavity reflector to perform the tuning.

In an alternative embodiment of the present invention, surface heaters are provided to thermally tune the semiconductor laser. In this embodiment, a first surface heater is disposed over the first micro-cavity reflector and adjustable to emit a first controllable amount of heat to the first micro-cavity reflector, A second surface heater is disposed over the second micro-cavity reflector and is adjustable to emit a second controllable amount of heat to the second micro-cavity reflector. The first micro-cavity reflector and the second micro-cavity reflector are thus thermally tunable by adjusting, or varying, an amount of heat emitted by at least one of the first surface heater and the second surface heater.

In another alternative embodiment of the present invention, a partially reflecting mirror is disposed on an opposing side of the gain section relative to the first micro-cavity reflector and the second micro-cavity reflector. This partially reflecting mirror may be non-wavelength selective. In another alternative embodiment of the invention, a substantially totally reflecting mirror is disposed on an opposing side of the gain section relative to the first micro-cavity reflector and the second micro-cavity reflector. In this embodiment, the partially reflecting mirror is distally spaced from the gain section.

In a further alternative embodiment of the present invention, a phase change section is provided, and is disposed between the first micro-cavity reflector and the second coupled micro-cavity reflector. The phase change section includes an associated electrode capable of selectively passing electrical current through the phase change section.

In an embodiment of the present invention, the first micro-cavity reflectors comprises a plurality of first micro-cavity reflectors, and the second micro-cavity reflector comprises a plurality of second micro-cavity reflectors. Moreover, a plurality of phase change sections may be provided, with each of the plurality of phase change sections being disposed between an associated pair of first micro-cavity reflectors and second micro-cavity reflectors.

The present invention also comprises methods of tuning a semiconductor laser. First, a semiconductor laser having a construction described in one of the foregoing embodiments is obtained or provided. Tuning of the semiconductor laser is performed by tuning the first micro-cavity reflector and the second micro-cavity reflector by varying amounts of electrical current injected into the first micro-cavity reflector and the second micro-cavity reflector to, in turn, substantially align a first reflective wavelength peak associated with the first micro-cavity reflector and a second reflective wavelength peak associated with the second micro-cavity reflector to form a supermode dominant resonance.

In one method of the present invention, fine-tuning of the semiconductor laser is performed by fine-tuning the first reflective wavelength peak and the second reflective wavelength peak to, in turn, modify the supermode resonance, by simultaneously passing current through the first micro-cavity reflector and second micro-cavity reflector to, in turn, alter the first reflective wavelength peak and the second reflective wavelength peak.

In a method of tuning a semiconductor laser having at least one phase change, or phase control section disposed between the first micro-cavity reflector and the second coupled micro-cavity reflector, simultaneously with the step of fine-tuning described above, current is passed through at least one of the phase change sections, or phase control sections, to maintain a constant optical cavity effective length.

In yet another method of the present invention, tuning and fine tuning is performed such that parity is maintained between a quantity of wavelength peaks associated with the first micro-cavity reflector and a quantity of wavelength peaks associated with the second micro-cavity reflector.

DETAILED DESCRIPTION OF INVENTION

When light passes through a medium of refractive index, $n_{eff}$. The actual wavelength of the light within that medium which will be referred to herein as $n_{eff}$, is the wavelength $\lambda$ divided by the value for the refractive index $n_{eff}$. In other words $\lambda = \lambda_o/n_{eff}$ where $n_{eff}$ is the effective refractive index of the medium as seen by the propagating light of wavelength $\lambda_o$ in free space.

The methods of fabricating the semiconductor devices of the present invention are conventional methods known generally in the industry. The epitaxial layers of the device can be grown by common methods such as metalorganic chemical vapor deposition or molecular beam epitaxy. Electrical contact can me made with the use of Ti/Pt/Au or other similar metals for making ohmic contact to the anode of the p-n junction and Ge—Au/Ni/Au or other similar metals for making ohmic contact to the cathode of the semiconductor laser. The patterning of the device is generally performed with either e-beam lithography or optical photolithography. The current confinement in the device is achieved with the usual methods of either oxidation of a III-V compound semiconductor or by etching, deposition and patterning of a deposited dielectric such as $SiN_x$ or $SiO_2$.

Figure 1:
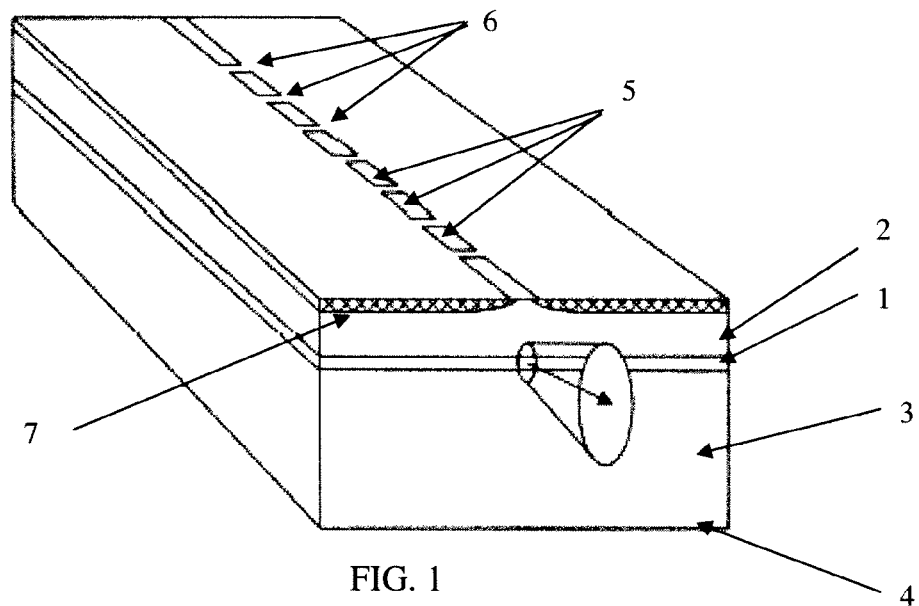
FIG. 1 is an elevated perspective diagram of the structure of a coupled-cavity laser of the present invention.
Figure 2:
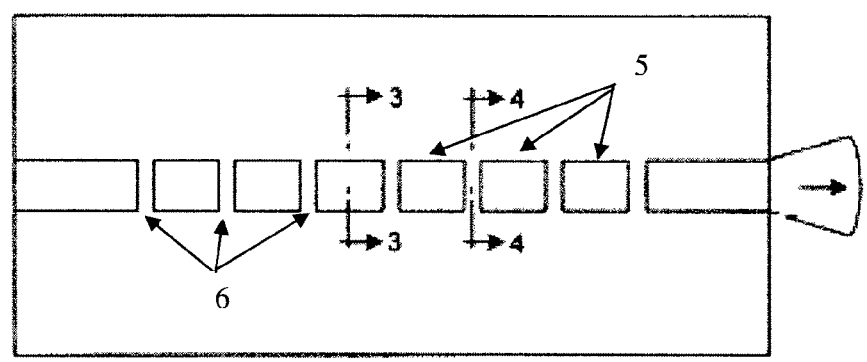
FIG. 2 is a top plan view of the coupled-cavity laser of FIG. 2.

Referring to FIGS. 1 and 2, a semiconductor laser in accordance with a first embodiment of the invention is shown as having an active region 1, an upper cladding region 2, a lower cladding region 3, a lower electrode 4, a plurality of optical micro-cavities 5, a plurality of separations or gaps 6 between the optical micro-cavities and defined by an associated native oxide region or etched regions 7.

Figure 3:
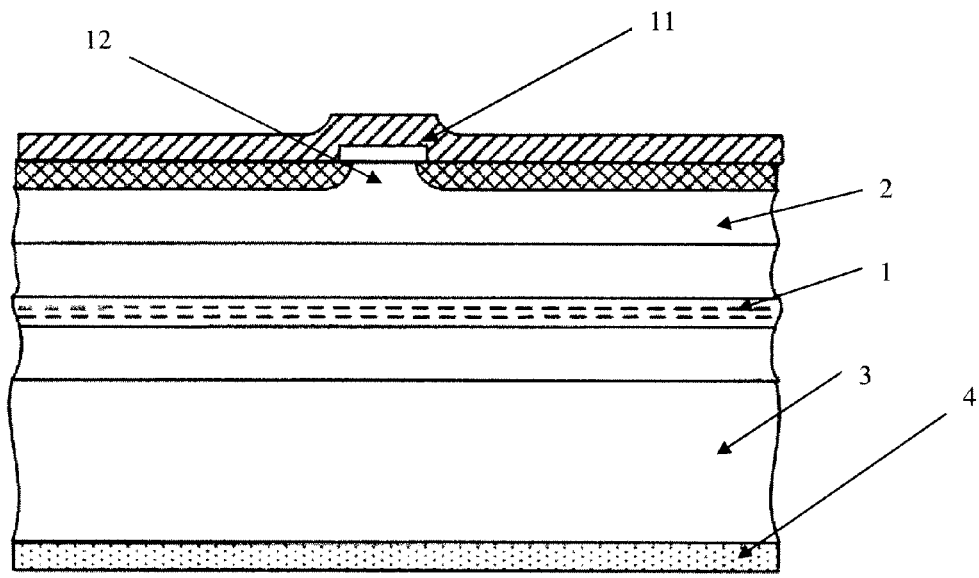
FIG. 3 is a cross-sectional view of the coupled-cavity laser, taken generally along lines 3-3 of FIG. 2 and showing, in particular, a micro-cavity of a coupled cavity laser.

FIG. 3 shows a vertical cross-section through a microcavity of the embodiment of the present semiconductor device shown in FIGS. 1-2. As shown in FIG. 3, active region 1 is sandwiched between upper clad region 2 and a lower clad region 3. Electrode 4 makes electrical contact to one of the terminals of the device. Another electrode 11 makes electrical contact to the micro-cavity 12.

Figure 4:
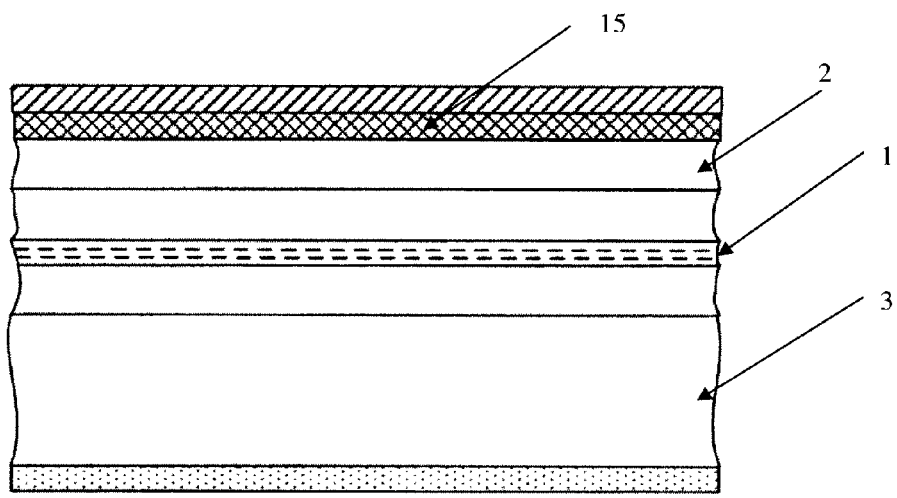
FIG. 4 is a cross-sectional view of the coupled-cavity laser, taken generally along lines 4-4 of FIG. 2 and showing, in particular, a region between micro-cavities of a coupled cavity laser.

FIG. 4 shows a vertical cross-section through a region separating two micro-cavities of the embodiment of the present semiconductor device shown in FIGS. 1-2. As shown in FIG. 4, active region 1 is sandwiched between lower clad region 3 and an upper clad region 2. Electrode 4 does not make electrical contact to one of the terminals of the device because of the presence of insulator 15 such as the native oxide of Al-bearing III-V semiconductors or a deposited dielectric as described previously. The laser is electrically pumped via electrodes 4 and 11, effecting light transmission in the active region.

Figure 5:
FIG. 5 is a scanning electron micrograph of a cross-section of a semiconductor showing a native oxide.

FIG. 5 shows a scanning electron micrograph of a typical cross section of an oxidized Al-bearing III-V semiconductor. The unoxidized region is masked by a layer of $SiN_x$. In this case, the oxide layer is approximately 500 nm deep and proceeds both vertically into the III-V semiconductor and laterally under the masked region. A separation between micro-cavities can be defined in this manner and the effective micro-cavity separation can be controlled by the depth of oxidation independently of the lithographic pattern.

Figure 6:
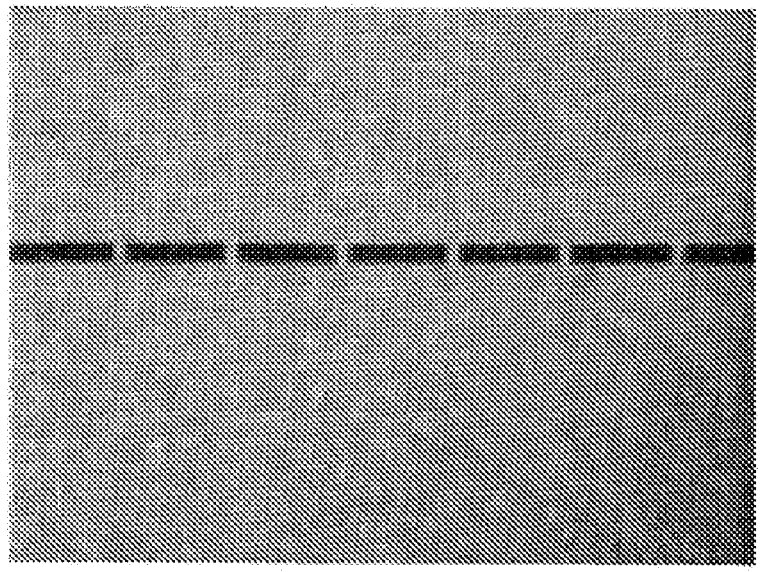
FIG. 6 is a photomicrograph of a top view of a coupled micro-cavity semiconductor laser.

FIG. 6 shows an optical photograph prior to top side metallization of a 20 μm optical micro-cavity separated by a 2 μm native oxide region.

Figure 7A:
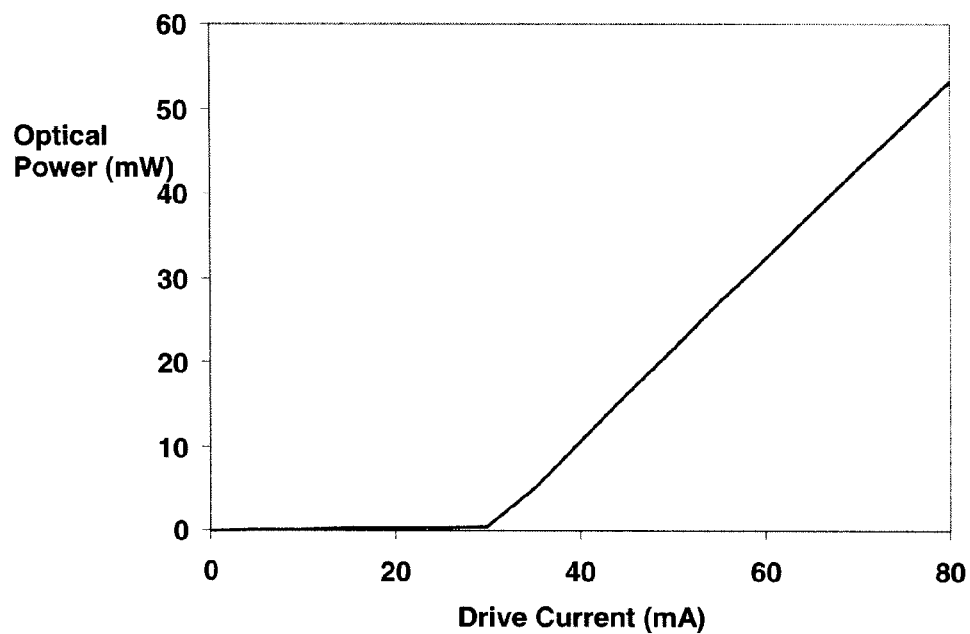
FIG. 7A is a plot of the optical power output versus current characteristics of a native-oxide-defined coupled cavity laser.
Figure 7B:
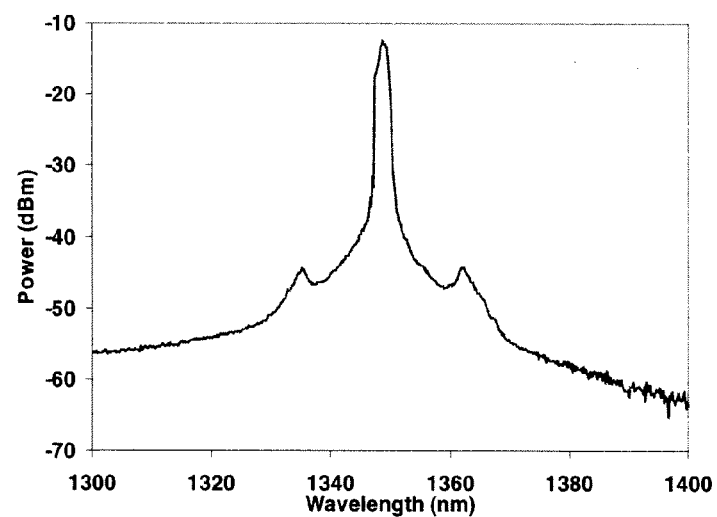
FIG. 7B is a plot of the spectrum of the native-oxide-defined coupled cavity laser having the optical power output versus current characteristics of FIG. 7A.

FIG. 7A shows the optical power versus dive current characteristics of a typical native-oxide-defined coupled cavity laser. The laser consisted of a 500 μm-long coupled cavity with 23 repetitions of the 20 μm/2 μm structure in a 700 μm-long laser diode. During measurements, the laser was mounted p-side up on silver epoxy and probe-tested. This arrangement does not provide particularly good heat sinking and, as expected, and the resulting output spectrum showed evidence of laser heating. The laser facets were uncoated and the depicted results represent the power output from only one facet. FIG. 7B shows the spectrum of the laser at a drive current of 50 mA. The threshold current is approximately 30 mA. The external differential quantum efficiency is 1.07 W/A. The coupled cavity filtered spectrum clearly shows a dominant center mode and two adjacent coupled-cavity modes. The side modes are suppressed by >30 dB below the dominant mode.

Figure 8:
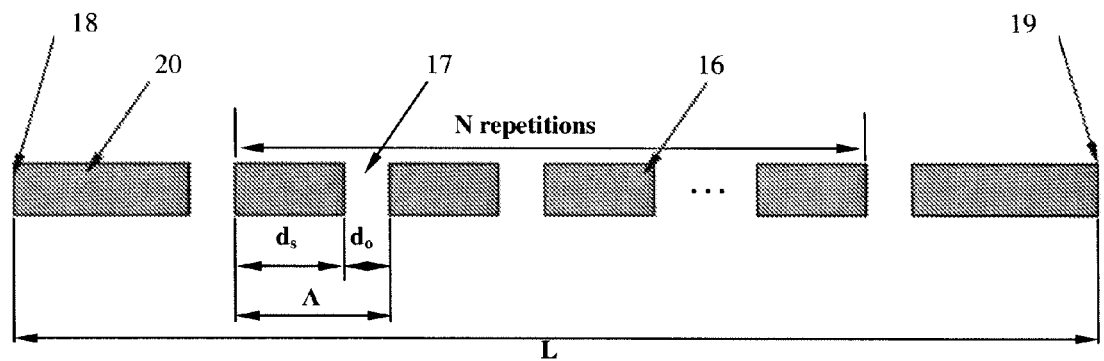
FIG. 8 is a diagram of the design features of an optical micro-cavity.
Figure 9:
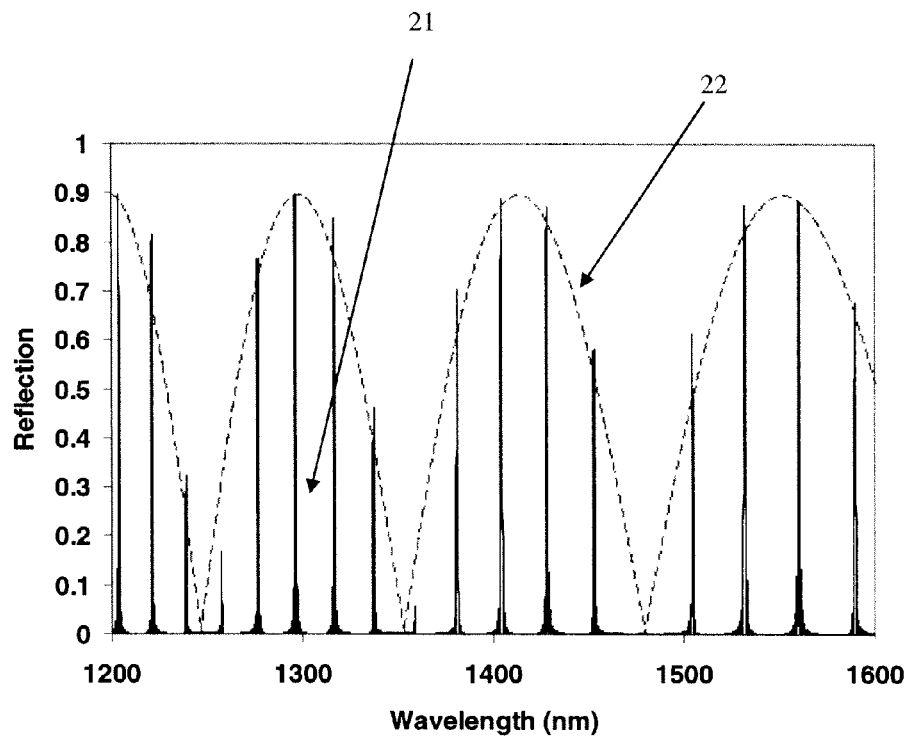
FIG. 9 is a plot of the spectral characteristics of an optical micro-cavity showing, in particular, the cavity resonances in solid lines and the envelope modulation due the cavity spacings in dashed lines.

FIG. 8 shows the detailed diagram of the design of the micro-cavities of the laser of FIG. 7. The micro-cavities 16 are of length $d_s$ and are separated by a native oxide 'break,' inter-cavity spacing $d_o$ 17. There are N repetitions of the micro-cavities and there are two gain regions at each end of the device 20, as well as facet reflectors 18 and 19. The center wavelength of operation the laser can be controlled by the length of the micro-cavities, $d_s$, and the spacing between the cavities, $d_o$, are graphically depicted in the plot of FIG. 9. The micro-cavity length, $d_s$ defines a set of optical resonances 21 in combination with the effective index $n_{eff}$ of the optical mode of the laser, and the separation between the cavities, do, further defines an envelope function having waveform 22, that is superimposed on the set of resonances of waveform 21. By proper design of the epitaxial layer structure and control of the effective index of the optical mode in the laser, and by choosing proper micro-cavity parameters $d_s$ and $d_o$, the wavelength of the laser diode may be controlled. In this case, the period of the coupled cavity section is 12.5 µm and the number of periods is 40. As expected, the reflection profile indicated a series of sharp, isolated modes. The free spectral range in the region of 1310 nm is 20 nm. As expected, the free spectral range is related to the period Λ by the expression $\Delta\lambda=\lambda^2/2n_{eff}\Lambda$, where $n_{eff}$ is the effective refractive index of the micro-cavity section. The envelope function provides a method of selecting the operating wavelength of the laser. By varying the length of the inter-cavity spacing, the phase of the envelope function changes. Selecting an inter-cavity spacing of 2.00 µm results in a mode with peak reflectivity at 1275 nm. Selecting an inter-cavity spacing of 2.05 µm results in a mode with peak reflectivity at 1300 nm. By increasing the length of the inter-cavity spacing from 2.05 µm to 2.10 µm, the mode with the peak reflectivity increases from 1300 nm to 1325 nm. Selecting an inter-cavity spacing of 2.15 µm results in a mode with peak reflectivity at 1350 nm. The wavelength of the laser could therefore be selected by selecting the length of the inter-cavity spacing. This could be done either during processing by changing the duration of the oxidation fabrication step (oxidation proceeds longitudinally as well as laterally), or by changing the length of the oxide section on the mask that is used to define the laser.

Figure 10:
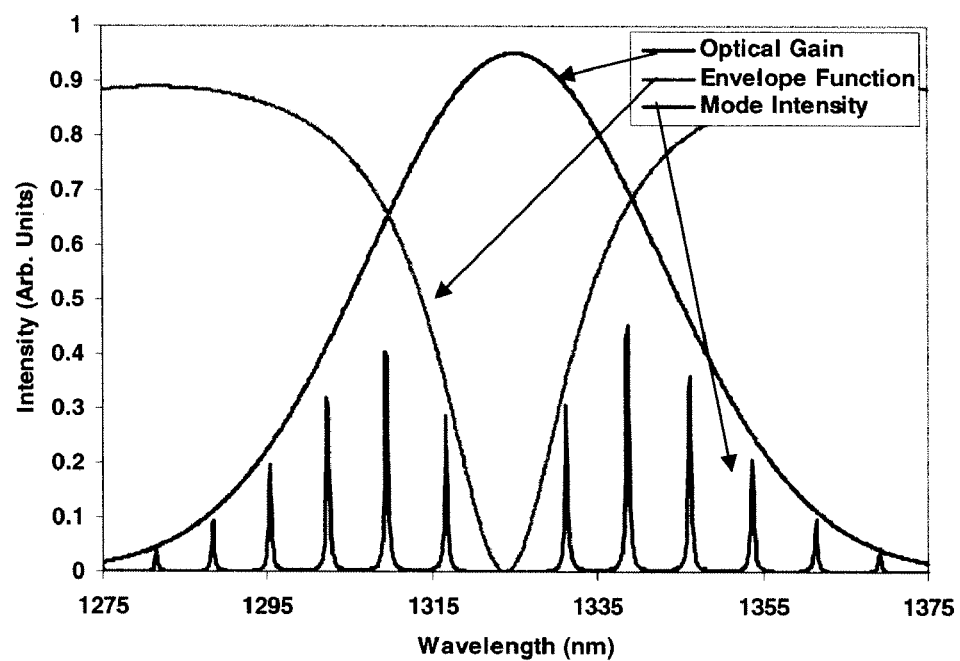
FIG. 10 is a plot of a simulation of the overlap of the optical gain spectrum with a coupled micro-cavity spectrum and envelope function created by the micro-cavity spacing.

FIG. 10 shows the effect of the spectrum of the optical cavity in relation to the gain spectrum of a laser device. The set of resonances ("Mode Intensity") determined by $d_s$ are modulated by the "Envelope Function" as determined by $d_o$. When these spectral filters are applied to the gain spectrum of the laser diode, the minimum in the resonances coincides with the peak in the laser gain spectrum. This has the effect of essentially inhibiting the lasing action of the device. The design of the coupled micro-cavity has created a 'stop band' in the gain spectrum of the laser.

Figure 11:
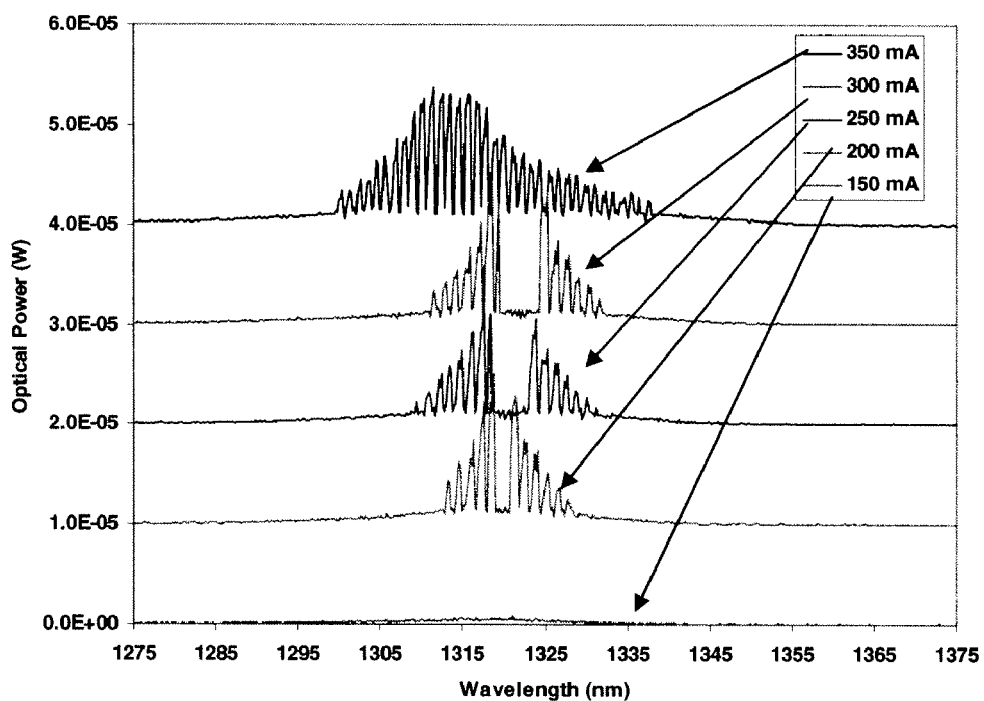
FIG. 11 is a plot of the optical spectra of a coupled cavity semiconductor laser showing the effect of the envelope function on the emission characteristics of the device of FIG. 10.

FIG. 11 shows the spectral output characteristics of a laser diode fabricated in a similar fashion to that having the characteristics depicted in FIGS. 7A and 7B, but in which the minimum of the micro-cavity resonances coincides with the peak in gain of the laser diode. As can be seen in FIG. 11, the micro-cavity reflector inhibits lasing action at the minimum of the laser spectrum, essentially creating a notch filter in the center of the gain spectrum. The optical spectra of the 20 µm/2 µm (micro-cavity/spacing) laser were measured using an Anritsu optical spectrum analyzer. The results are shown in FIG. 11. The most obvious feature is that there are two sets of laser modes with a gap between them. This may be explained as follows: The gain band of the laser structure is centered on approximately 1320 nm. As discussed above, the oxide laser structure supports a set of coupled cavity modes that are modulated by an envelope function. The gap in the modes depicted in FIG. 11 corresponds to a stop band, i.e., the minimum of the envelope function. The stop band lies at the center of the peak gain of the Fabry Perot laser cavity, thereby suppressing lasing action and shifting the lasing to modes on either side of the stop band. This is depicted in schematic form in FIG. 10. This suppression of laser action at the wavelength at which maximum optical gain occurs partially accounts for the higher threshold as indicated by the large drive currents shown in FIG. 11. Note that these drive currents are approximately 5 to 12 times the threshold current of a similar device (FIGS. 7A-7B) but with a shallower oxide which shifts the envelope function so that the minimum is not aligned with the gain peak of the laser diode.

Figure 12:
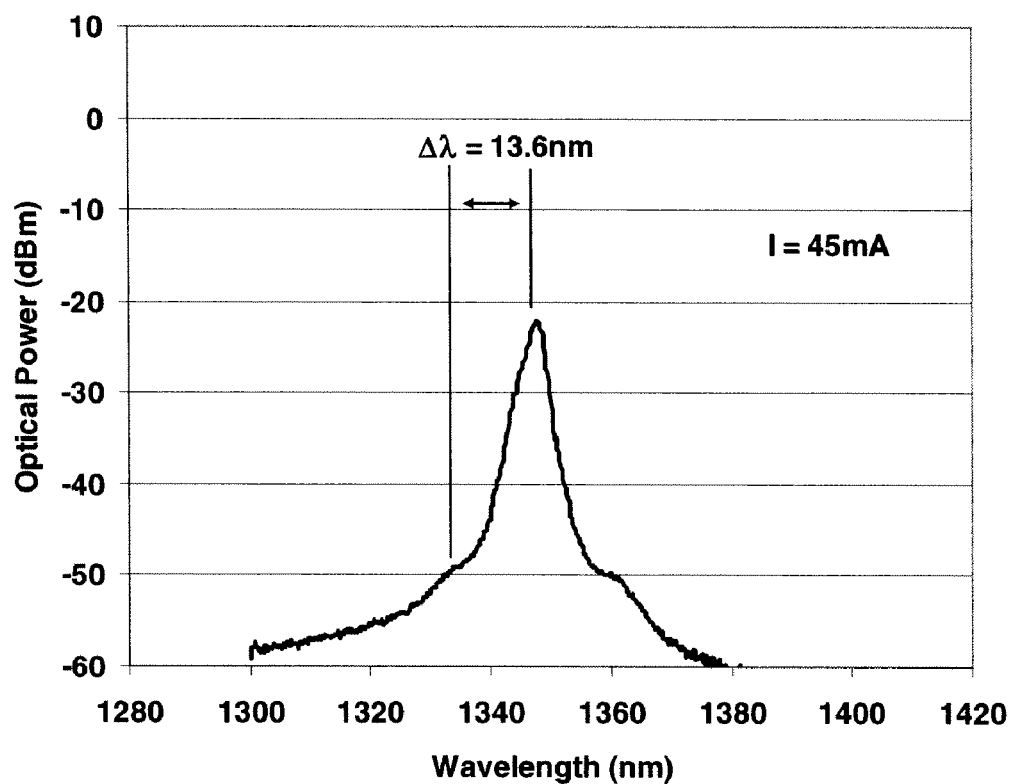
FIG. 12 is a plot of the optical spectrum of a coupled cavity laser at a bias current of 45 mA.
Figure 13:
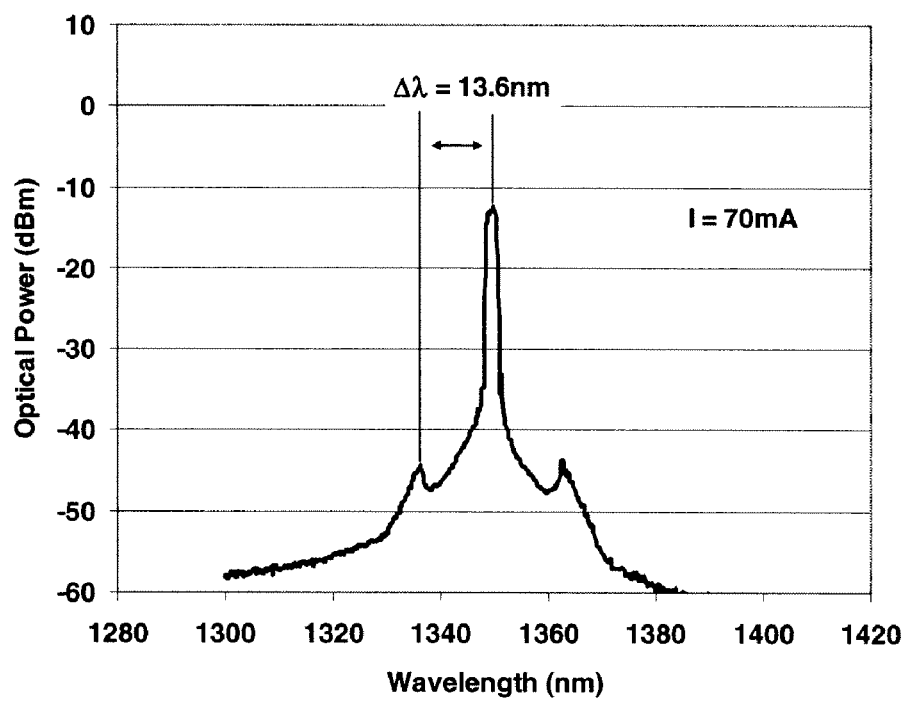
FIG. 13 is a plot of the optical spectrum of a coupled cavity laser at a bias current of 70 mA.
Figure 14:
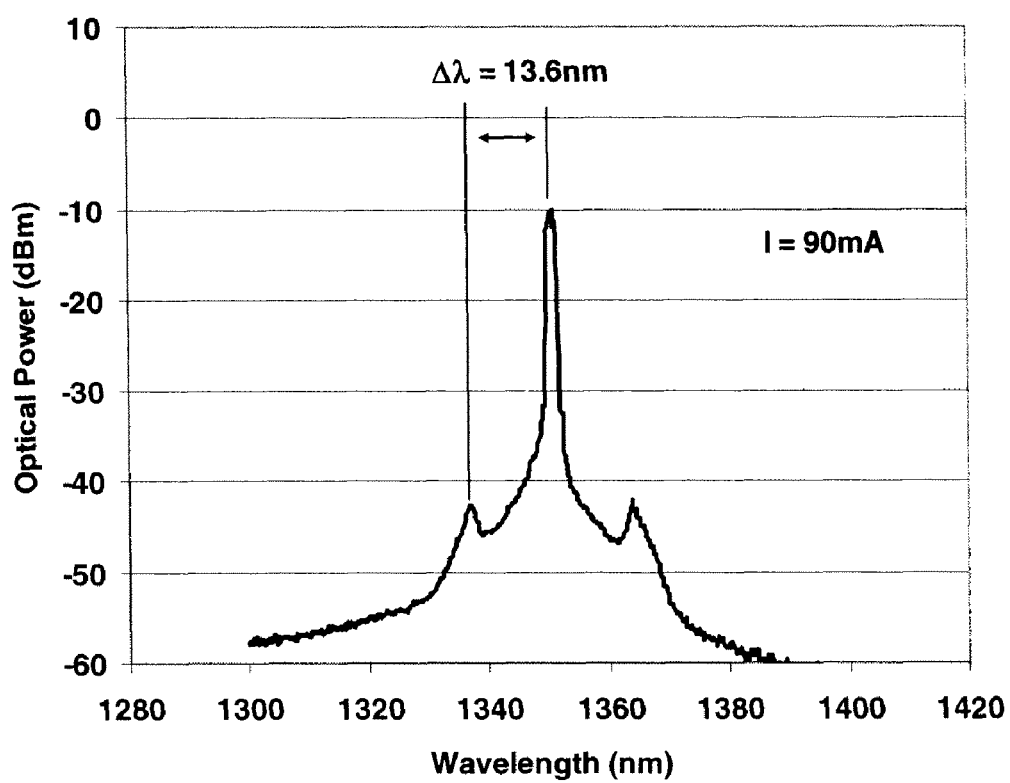
FIG. 14 is a plot of the optical spectrum of a coupled cavity laser at a bias current of 90 mA.

FIG. 12 shows the emission spectra of the laser of FIGS. 7A-7B at a drive current of 45 mA. Just above threshold, the spectrum consists of a single longitudinal mode with a peak at 1347.6 nm. As the drive current is increased above threshold as seen in FIG. 13 (bias current of 70 mA), two side modes become evident. The side modes are separated from the main mode by 13.6 nm. This is consistent with the spacing of the modes predicted by device simulation. The side-modes of the coupled cavity are suppressed by more than 30 dB. FIG. 14 shows the output spectra of the same device at a bias current of 90 mA. Note that the spectral separation has not significantly changed from that of FIG. 13, indicating a stable optical resonance relative to drive current.

In another embodiment of the present invention, a tunable laser, fabricated using two or more separate micro-cavities, is provided. An example of a tunable laser of the present invention, using micro-cavities, is shown in FIG. 15.

Figure 15:
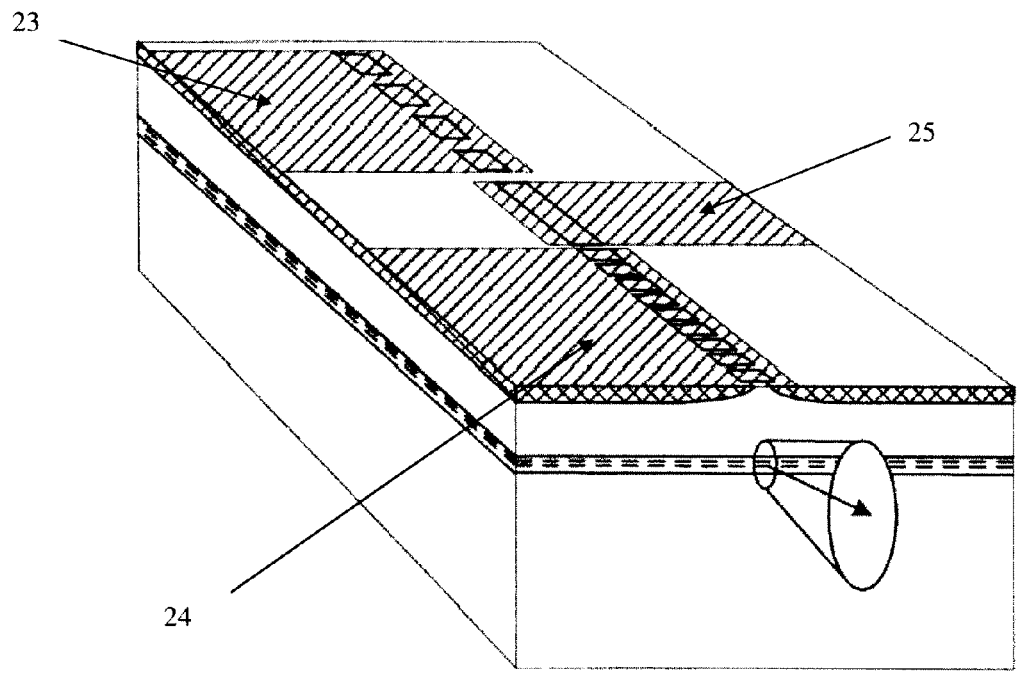
FIG. 15 is an elevated perspective diagram of the structure of a tunable coupled-cavity laser embodiment of the present invention.
Figure 16:
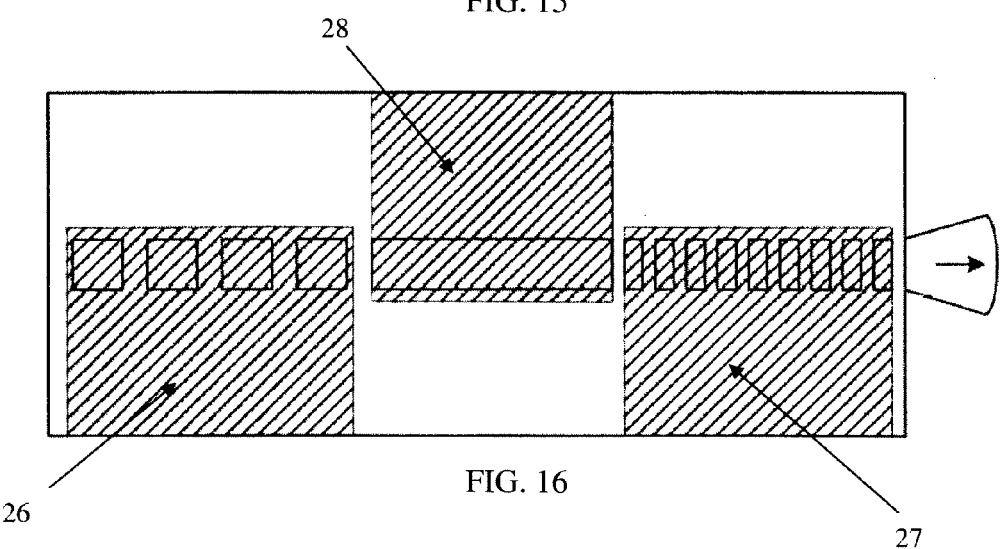
FIG. 16 is a top plan view of the structure of the tunable coupled-cavity laser of FIG. 15.

Referring to FIG. 15, there is shown a laser in accordance with the present invention and having a first micro-cavity reflector 23, a second micro-cavity reflector 24, and gain or phase control section 25. FIG. 16 shows a top view of the tunable laser where the first micro-cavity reflector is connected with a separate electrode 26, the second micro-cavity reflector is connected by a second electrode 27, and the gain or phase control section is contacted via a third separate electrode 28.

Figure 17A:
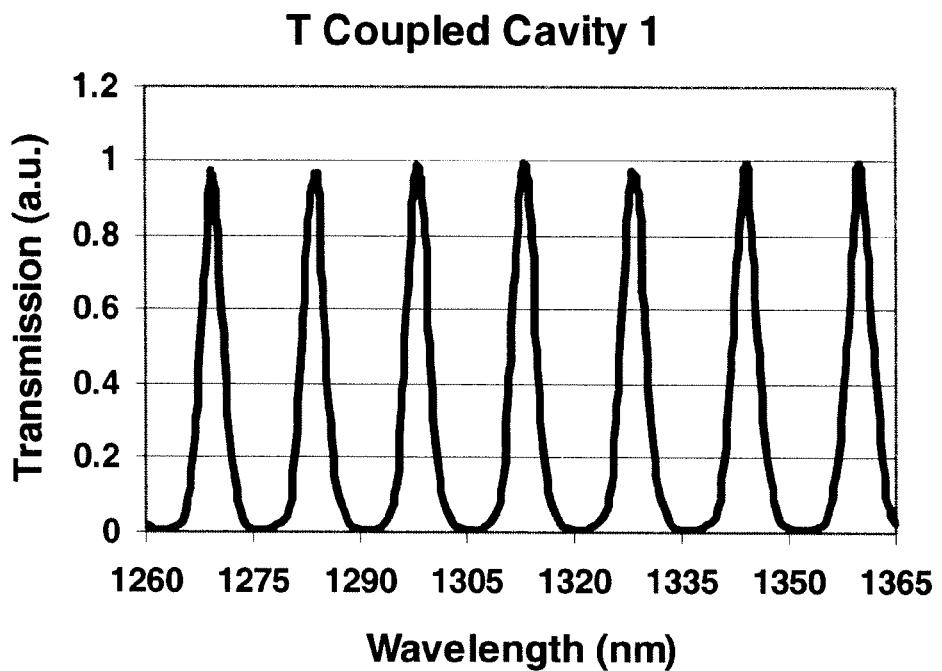
FIG. 17A is a plot of a simulation of the optical spectrum of the filtering function of the native-oxide coupled cavities demonstrating vernier tuning using two coupled cavities and showing, in particular, the transmission spectrum of the first coupled cavity.
Figure 17B:
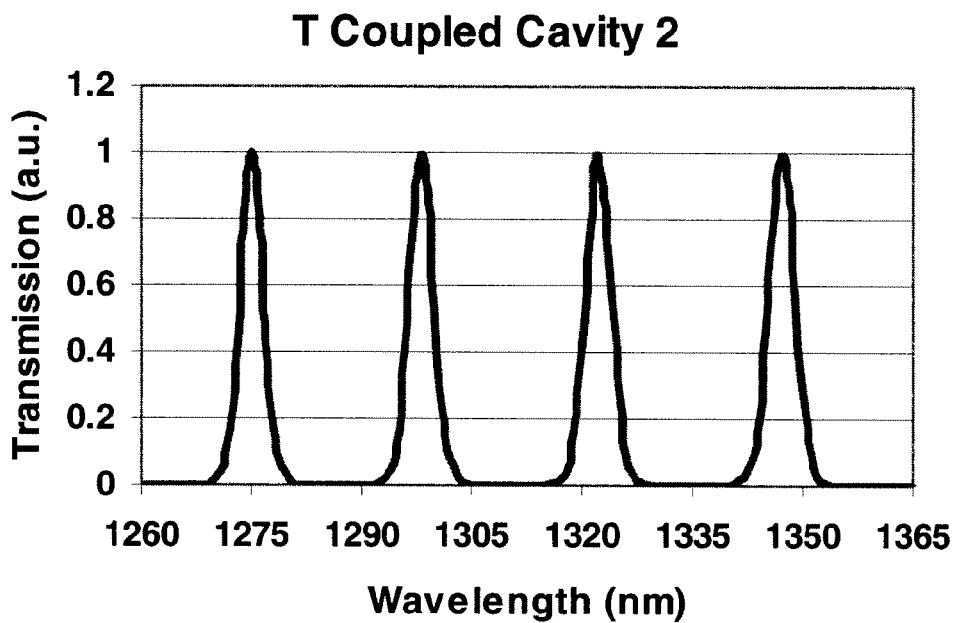
FIG. 17B is a plot of a simulation of the optical spectrum of the filtering function of the native-oxide coupled cavities demonstrating vernier tuning using two coupled cavities and showing, in particular, the transmission spectrum of the second coupled cavity.
Figure 17C:
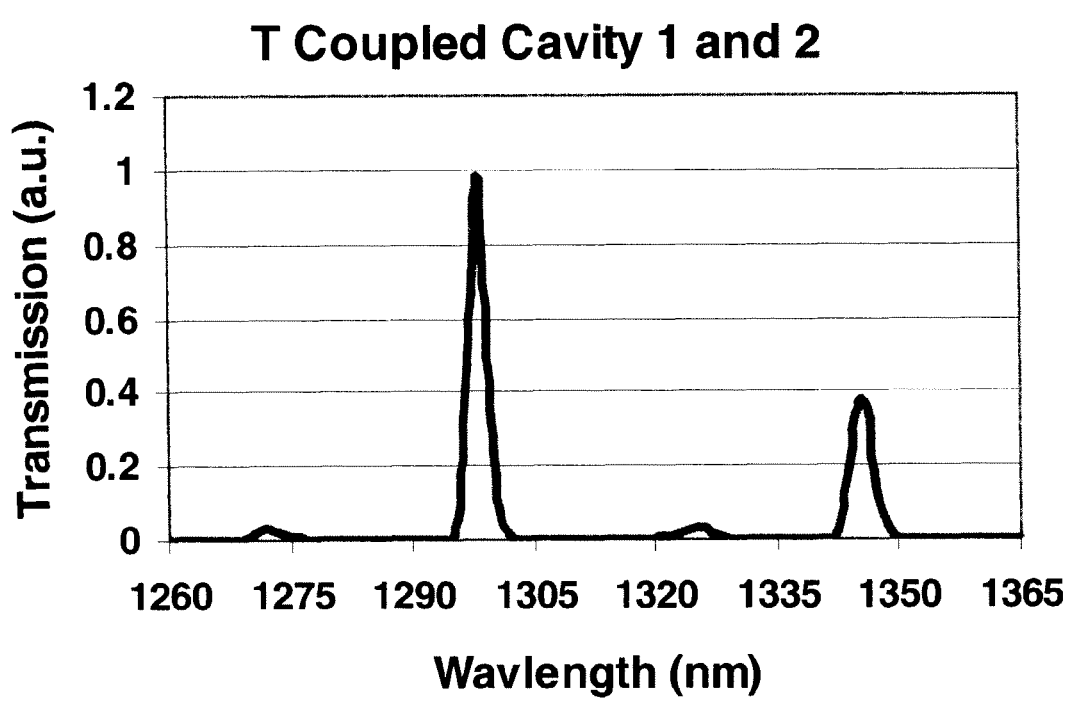
FIG. 17C is a plot of a simulation of the optical spectrum of the filtering function of the native-oxide coupled cavities demonstrating vernier tuning using two coupled cavities and showing, in particular, the combined coupled cavity transmission spectrum of the first and second coupled cavities of FIGS. 17A and 17B.

In FIG. 17A, a typical transmission spectrum of a set of coupled cavities (without spacing between the cavities) for the first reflector is represented; FIG. 17B represents the transmission spectrum of a second set of coupled cavities (without spacing between the cavities) for the second reflector. FIG. 17C shows the combined spectra of first reflector and the second reflector, showing a single dominant optical mode.

It can be seen that the combination of first and second reflectors has the ability, when combined in a single laser device, to enable a single spectral mode from the set of resonances available from the first and second reflectors. In addition, as current is injected into the first or second reflector, the index of refraction under the reflector will be lowered in proportion to the injected current, enabling a shift in the resonant wavelength for the reflector. As the two reflector's resonances are tuned, the selected resonance mode is shifted in a vernier fashion across the gain spectrum of the laser device. Whilst electric current causes a lowering of the material refractive index, and thus provides a tuning means, other tuning methods rely upon an increase in material refractive index, as is the case when temperature increase is used as the tuning means.

In order to achieve stimulated emission in the laser it is necessary to have both a population inversion of electron energy states within the gain material of the gain section and to get the gain of at least one, and preferably only one, wavelength to be above the lasing threshold. A population inversion is created once sufficient current is passed through the diode electrodes. That light will then be partially reflected by the two reflectors and back into gain section.

Other arrangements than those of FIGS. 15 and 16 for the two reflectors can alternatively be used. For example, the reflectors can be arranged at one end of the laser device with a phase control section between the two, and a gain section at the other end of the device.

Referring to FIG. 16, in order to fine tune the laser emission wavelength, one must shift the reflection peak by a small amount once the laser has been tuned to a supermode position. This shift is obtained by simultaneously increasing or decreasing the current at both electrode 26 and electrode 27. This has the effect of moving both reflector spectra resonances to the left at the same time, and thus both peaks will move to the left together and thus the supermode peak will move to a shorter wavelength as both resonances move together.

When the fine-tuning occurs, it has the effect of reducing the optical cavity length of the laser. To counteract this, a phase change section 25 operated by electrode 28 is provided as shown in FIGS. 15 and 16. As the laser is fine tuned, a current is passed through electrode 28 and this has the effect of reducing the refractive index of the material in the phase change section to counteract the change in the cavity section occurring as the position of the resonance peak is altered within the laser.

The tuning means has been described above as being provided solely as by means of tuning current. There are other ways, however, to produce tuning, for example by using heat—e.g. thermal effects via surface heaters over the reflectors and electro refraction—electrical field tuning by driving the phase gratings in reverse bias to vary the refractive index, as opposed to the normal forward bias mode where current is injected into the structure.

It will be understood that modifications and variations may be effected without departing from the spirit and scope of the present invention. It will be appreciated that the present disclosure is intended as an exemplification of the invention and is not intended to limit the invention to the specific embodiment illustrated and described. The disclosure is intended to cover, by the appended claims, all such modifications as fall within the scope of the claims.

What is claimed is:

1. A coupled-cavity semiconductor laser device, comprising:
   a semiconductor active region disposed between a first semiconductor confining layer and a second semiconductor confining layer;
   a plurality of first electrode elements coupled with the first confining layer, at least a portion of each of the first electrode elements being spaced apart from and substantially collinear to each other;
   at least one second electrode coupled with the second confining layer;
   a plurality optically coupled micro-cavities, each of the optically coupled micro-cavities being defined by an associated one of said plurality of first electrode elements;
   at least one inter-cavity spacing comprising a region between an adjacent pair of optically coupled micro-cavities and having a length selected to produce a desired dominant resonance wavelength of the semiconductor laser;
   the semiconductor laser device being capable of emitting light in the active region upon the application of electrical current between at least one of the first electrode elements and the second electrode, the emitted light having a plurality of wavelength resonances, the plurality of wavelength resonances having values determined at least in part by a length of the plurality of optically-coupled micro-cavities, the plurality of wavelength resonances having a dominant resonance wavelength having a value determined at least in part by the selected length of the at least one inter-cavity spacing.

2. The invention according to claim 1, wherein at least one of the optically coupled micro-cavities and the least one of the inter-cavity spacing are defined by etching a portion of the first confining layer.

3. The invention according to claim 1, wherein at least a portion of the first confining layer comprises an aluminum-bearing III-V semiconductor material, and wherein at least one of the optically coupled micro-cavities and the at least one of the inter-cavity spacing are defined by an oxide of the aluminum-bearing III-V semiconductor material formed in at least a portion of the first confining layer.

4. The invention according to claim 1, wherein at least a portion of the first confining layer comprises an aluminum-bearing III-V semiconductor material, and wherein at least one of the optically coupled micro-cavities and the at least one inter-cavity spacing are defined by etching of the first confining layer and oxidation of the aluminum-bearing III-V semiconductor material in at least a portion of the first confining layer.

5. The invention according to claim 1, wherein at least a portion of the at least one of the optically coupled micro-cavities and at least a portion of the at least one micro-cavity spacing are defined by etching at least a portion of the second confining layer.

* * * * *